United States Patent
Yang

(10) Patent No.: US 12,340,834 B2
(45) Date of Patent: Jun. 24, 2025

(54) MEMORY DEVICES HAVING A RANDOM NUMBER GENERATOR FOR PROTECTING MEMORY CELLS, AND METHODS FOR PROTECTING MEMORY DEVICES

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 154 days.

(21) Appl. No.: 18/374,151

(22) Filed: Sep. 28, 2023

(65) Prior Publication Data
US 2025/0111870 A1    Apr. 3, 2025

(51) Int. Cl.
*G11C 11/406* (2006.01)
*G11C 11/408* (2006.01)

(52) U.S. Cl.
CPC .. *G11C 11/40622* (2013.01); *G11C 11/40603* (2013.01); *G11C 11/4085* (2013.01)

(58) Field of Classification Search
CPC ........ G11C 11/40622; G11C 11/40603; G11C 11/4085; G11C 11/406; G11C 11/40611; G11C 11/4078; G11C 11/408; G11C 11/4087
USPC ............................................ 365/222, 230.06
See application file for complete search history.

(56) References Cited

U.S. PATENT DOCUMENTS 11,094,369 B1 * 8/2021 Joo .................... G11C 7/106
11,210,031 B1 * 12/2021 Mekhanik ............. G06F 3/0679

FOREIGN PATENT DOCUMENTS

| CN | 104715789 B | 6/2019 |
| CN | 114420181 B | 9/2023 |
| TW | 202322121 A | 6/2023 |
| TW | 202326726 A | 7/2023 |
| TW | I809719 B | 7/2023 |
| WO | WO2016083865 A1 | 6/2016 |

OTHER PUBLICATIONS

Office Action and and the search report mailed on Oct. 25, 2024 related to Taiwanese Application No. 112144962.
Office Action and and the search report mailed on Jan. 9, 2025 related to Taiwanese Application No. 113117002.

* cited by examiner

*Primary Examiner* — Michael T Tran
(74) *Attorney, Agent, or Firm* — Xuan Zhang

(57) ABSTRACT

A memory device and a method for protecting the same are provided. The memory device includes a controller configured to refresh one of word lines during a first refresh cycle in response to a refresh signal, a number trimmer configured to generate a modified first number according to a first number generated by a random number generator, wherein the modified first number is less than a first predetermined number. The memory device further includes a counter configured to receive the modified first number as an initial value, and to be turned on in response to the refresh signal. The controller is configured to obtain an address of a first word line being accessed when the counter counts to zero, and refresh a second word line during a second refresh cycle, wherein an address of the second word line is adjacent to the address of the first word line.

20 Claims, 10 Drawing Sheets

MEMORY DEVICES HAVING A RANDOM NUMBER GENERATOR FOR PROTECTING MEMORY CELLS, AND METHODS FOR PROTECTING MEMORY DEVICES

TECHNICAL FIELD

The present disclosure relates to a memory device and a method of protecting the same, and more particularly, to a memory device including a protect circuit for protecting a word line.

DISCUSSION OF THE BACKGROUND

Dynamic random access memory (DRAM) is a type of random access memory that stores each bit of data in a separate capacitor. A simplest DRAM cell comprises a single transistor and a single capacitor. If charges are stored in the capacitor, the cell is said to store a logic HIGH, depending on the convention used. Then if no charge is present, the cell is said to store a logic LOW. Since the charges in the capacitor dissipate over time, DRAM systems require additional refreshing circuitries to periodically refresh the charges stored in the capacitors. Since a capacitor can store only a very limited amount of charges, in order to quickly distinguish the difference between a logic "1" and a logic "0", two bit-lines (BLs) are typically used for each bit, wherein the first in the bit line pair is known as a bit line true (BLT) and the other is the bit line complement (BLC). The single transistor's gate is controlled by a word line (WL).

Row hammer is a security issue utilizing an unintended and undesirable side effect in DRAM, in which memory cells interact electrically between themselves by leaking their charges, possibly changing the contents of nearby memory rows (word lines) that were not addressed in the original memory access. Row hammer can be triggered by specially memory access patterns that rapidly activate the same memory rows (word lines) numerous times. Accordingly, the memory cells connected to the adjacent word lines would leak their charges and would be hard to remain the original content to the next periodical refresh cycle. The attacker (or hacker) can use the row hammer effect to change the content of the nearby memory rows, resulting in the memory device malfunctioned. Therefore, it is called for to develop an approach of protecting the memory device (particularly, the word lines) to alleviate the problems described.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a memory device. The memory device includes a plurality of word lines, a controller configured to refresh at least one of the plurality of word lines during a first refresh cycle in response to a refresh signal, a random number generator configured to generate a first number, and a number trimmer connected to the random number generator. The number trimmer is configured to generate a modified first number according to the first number, wherein the modified first number is less than a first predetermined number. The memory device further includes a counter electrically coupled to the random number generator and the number trimmer, wherein the counter is configured to receive the modified first number as an initial value of the counter, and configured to be turned on in response to the refresh signal. The controller is further configured to obtain an address of a first word line being accessed when the counter counts to zero, and refresh a second word line during a second refresh cycle, wherein an address of the second word line is adjacent to the address of the first word line.

Another aspect of the present disclosure provides a memory device. The memory device includes a controller configured to refresh at least one of a plurality of word lines during a first refresh cycle in response to a refresh signal, a random number generator configured to generate a first number, a number trimmer connected to the random number generator. The number trimmer is configured to modify the first number to be a modified first number, and the modified first number is less than a first predetermined number. The memory device further includes a counter electrically coupled to the random number generator and configured to receive the modified first number as an initial value of the counter and start counting from the initial value in response to the refresh signal, and an address register electrically coupled to the counter and configured to store an address of a first word line being active when the counter decrements to zero. The controller is configured to access the address register to obtain the address of the first word line and protect a second word line during a second refresh cycle, wherein an address of the second word line is adjacent to the address of the first word line.

Another aspect of the present disclosure provides a method for protecting a memory device, wherein the memory device includes a plurality of word lines. The method includes refreshing a first word line of the plurality of word lines during a first refresh cycle in response to a refresh signal; generating a first number by a random number generator; decreasing, by a number trimmer, the first number to be a second number when the first number is greater than a first predetermined number; starting counting down from the second number by a counter in response to the refresh signal; obtaining, by a controller, an address of a second word line being accessed when the counter reaches zero; protecting a third word line during a second refresh cycle in response to the refresh signal, wherein an address of the third word line is adjacent to the address of the second word line.

The embodiments of the present disclosure provide a memory device having a protect circuit for selecting and protecting a possible attacked word line. In particular, the protect circuit of the memory device can protect the word lines (memory cells) from row hammer. To trigger the row hammer, the attacker rapidly activates the same memory rows, such that the adjacent memory rows that are not activated may leak their charges. The present protect circuit provides a random number generator and a counter, so as to randomly select and protect a possible memory row. The counter can be configured to count down from a random number generated by the random number generator. When the counter counts to zero, an address of the memory row that is activated can be obtained. In other words, the memory row is selected within those having activated between refresh cycles. In such a case, the selecting pool includes the memory rows having activated between refresh cycles. In addition, to avoid the random number generated by the random number generator exceeds the maximum number of activations between two refresh cycles, the number trimmer is provided to modify the random number to be in a range from zero to a predetermined number (i.e., the maximum number of activations between refresh cycles). Because the nearby memory rows adjacent to those activated memory rows have a higher possibility of occurring row hammer effect, they will be the protected target in the following refresh cycle.

Generally, the activation amount to trigger the row hammer cannot be accomplished within two refresh cycles. For example, a memory device with 8192 rows can have about 170 activations between two refresh cycles, and the activation amount for triggering the row hammer may be 10000 or more to the same row. Therefore, protecting additional memory row that possibly occurs row hammer in every refresh cycle can eliminate the row hammer issue. Furthermore, the memory device can include a number trimmer to determine whether the random number, for choosing a particular one from memory rows, exceeds the maximum number of activations between two refresh cycles (i.e., 170 in this case), and then decrease the random number to be in a range of 0 to 170. Accordingly, security and performance of the memory device can be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It can also be appreciated by those skilled in the art that such equivalent constructions do not depart from the spirit and scope of the disclosure as set forth in the appended claims.

BRIEF DESCRIPTION OF THE DRA WINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
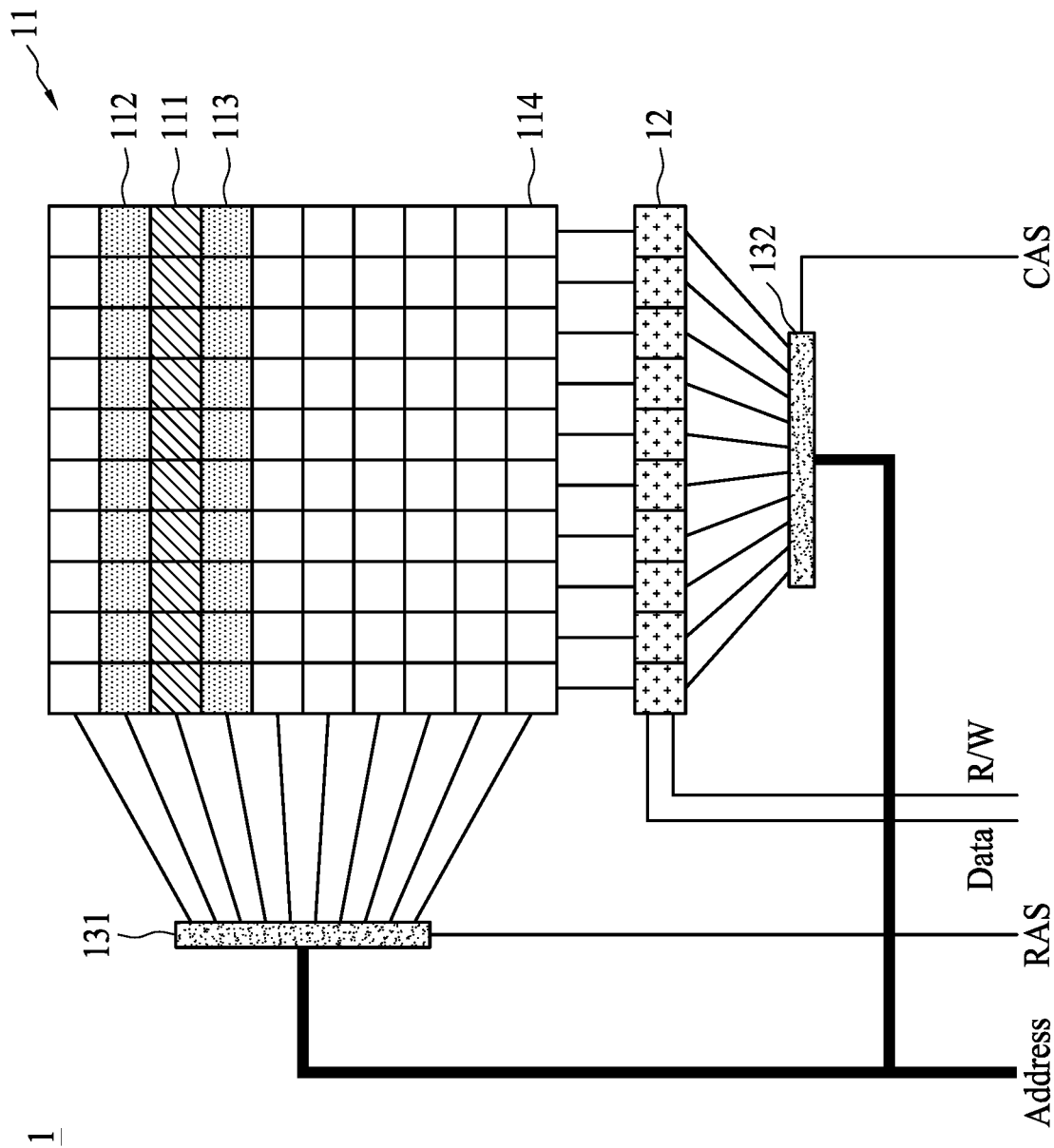
FIG. 1 is a schematic diagram of a memory device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be noted that the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

FIG. 1 is a schematic diagram of a memory device 1, in accordance with some embodiments of the present disclosure. The memory device 1 can include an array of memory cells 11, sense amplifiers 12, a row address decoder 131, and a column address decoder 132. In some embodiments, the memory device 1 can be a DRAM.

Referring to FIG. 1, the array of memory cells 11 can include multiple rows and columns. Each column of memory cells can share one bit line or a pair of bit lines. Each row of memory cells can share one word line. In some embodiments, a single memory cell can include a capacitor and a transistor, and be configured to store a bit of data therein. The charge state of a capacitor (charged or discharged) can determine whether such memory cell stores "1" or "0" as a binary value.

In some embodiments, the memory address of the array of memory cells 11 applied to a matrix can be expressed as the row address and column address, which are processed by the row address decoder 131 and column address decoder 132. When the row address detector 131 selects a particular row (for example, memory row 114) for a read operation (the selection is also known as row activation), bits from all memory cells in the particular row can be transferred into the sense amplifiers 12. In some embodiments, one sense amplifier 12 is for each column of memory cells to temporarily hold the data. In some embodiments, the column address decoder 132 can select the exact bit from the sense amplifiers 12. In some embodiments, the sense amplifiers 12 can be configured to receive or transmit the data in response to the read/write signal R/W. Write operations decode the addresses in a similar way, but entire rows can be rewritten for the value of a single bit to be changed.

Due to storing data bits in capacitors that have a natural discharge rate, the state stored in the memory cells 11 may lose over time and thus periodic rewriting of all memory cells is required for preserving the information, which is a process known as refreshing. Each memory refresh cycle can refresh one or more rows of memory cells, and all the memory cells can be refreshed repeatedly in a consecutive cycle. The memory refresh can be accomplished in multiple types. In some embodiments, the memory refresh can be conducted by different patterns of signals, such as row address strobe (RAS) refresh, column-address-strobe-before-row-address-strobe (CAS-before-RAS) refresh (also called CBR refresh for short), and hidden refresh.

To trigger the row hammer, the same memory row 111 can be activated in a high frequency and amount. When the frequency and amount of activation to the memory row 111 is greater enough, the adjacent memory rows 112 and 113 that are not activated may leak their charges and thus the data/content stored therein may lose.

The present protect circuit provides a random number generator and a counter (detailed description thereof can be found in FIG. 2), so as to randomly select and protect a possible memory row. The counter can be configured to count down from a random number generated by the random number generator. When the counter counts to zero, an address of the memory row (such as the memory row 111) that is activated can be obtained. In other words, the memory row is selected within those having activated between refresh cycles. The nearby memory rows 112 and 113 adjacent to the activated memory row 111 have a higher possibility of occurring row hammer effect, and thus they will be protected in the following refresh cycle. In some embodiments, the memory rows 112 and 113 and a planned refresh memory row 114 can be refreshed in the following refresh cycle.

Figure 2:
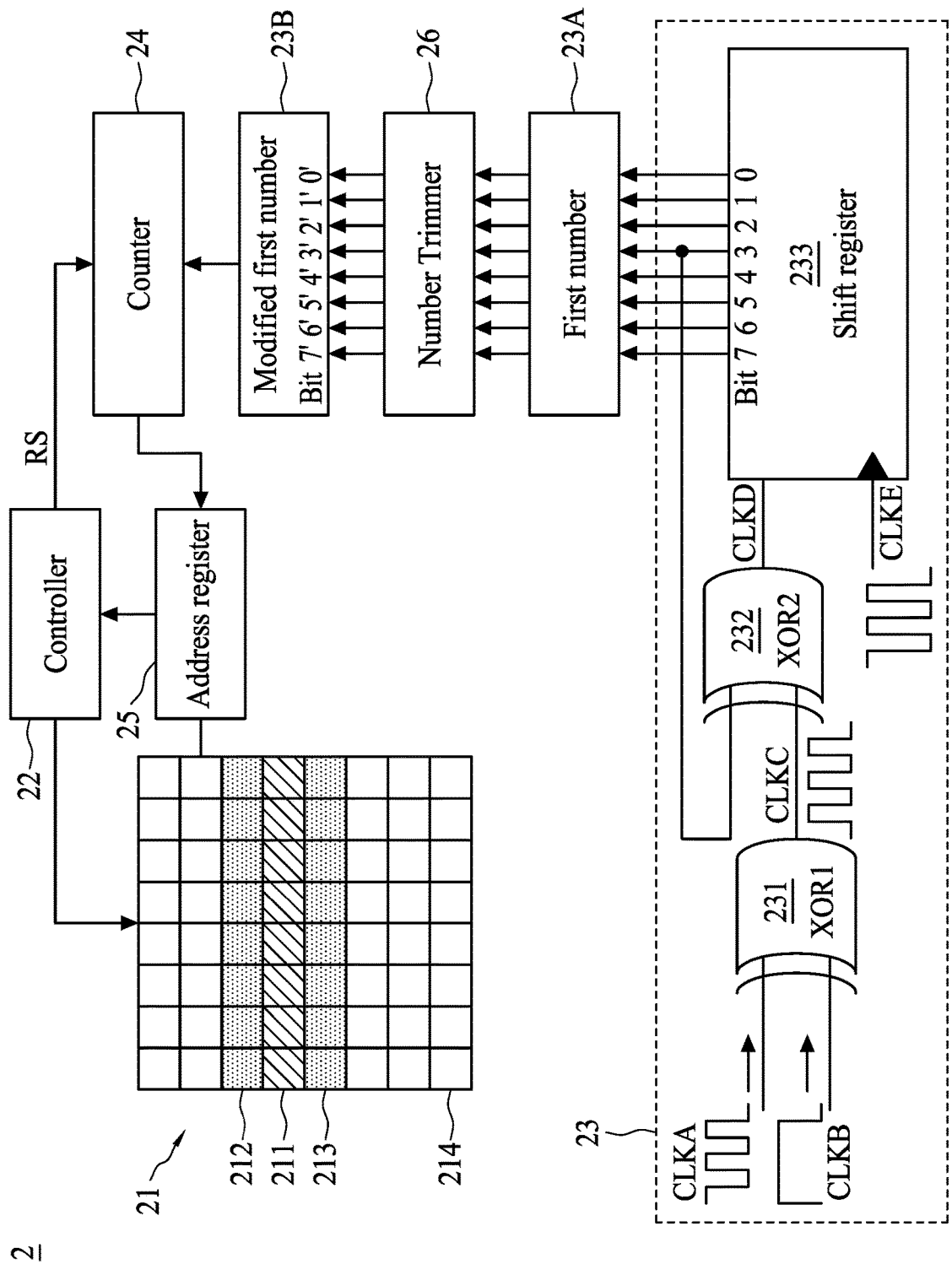
FIG. 2 is a schematic diagram of a memory device, in accordance with some embodiments of the present disclosure.

FIG. 2 is a schematic diagram of a memory device 2, in accordance with some embodiments of the present disclosure. Referring to FIG. 2, the memory device 2 can include an array of memory cells 21, a controller 22, a random number generator 23, a counter 24, an address register 25, and a number trimmer 26. In some embodiments, the memory device 2 can be a dynamic random-access memory (DRAM).

In some embodiments, the array of memory cells 21 can include a plurality of word lines. In some embodiments, the array of memory cells 21 can include a possible target word line 211 being accessed, two adjacent word lines 212 and 213 nearby the possible target word line 211, and a normal word line 214. The normal word line 214 can locate in anywhere of the array 21. For example, the normal word line 214 can be the edge word line or a word line sandwiched by two word lines. In one embodiment, the normal word line 214 can be apart from the possible target word line 211. In another embodiment, the normal word line 214 can be adjacent to the possible target word line 211 (not shown).

The controller 22 can be configured to refresh at least one of the word lines during a first refresh cycle in response to a refresh signal RS. In some embodiments, the refresh signal RS can be RAS refresh command or CBR refresh command. The controller 22 can be configured to refresh one or more word line during one refresh cycle. In some embodiments, the controller 22 can be configured to refresh one, two, three, four, or more word lines at the same time. In some embodiments, the controller 22 can be configured to refresh all of the array of memory cells 21 cycle by cycle.

The random number generator 23 can be configured to generate a first number 23A. The first number 23A can be a positive integer. In some embodiments, the first number 23A can be in binary. The first number 23A can be represented by a binary sequence having more than 2 bits. For example, the first number 23A can be represented by a binary sequence having 8 bits. That is, the first number 23A can be a number in a range of 0 to 255.

Referring to FIG. 2, the random number generator can include logic gates 231 and 232 and a shift register 233.

In some embodiments, the logic gate 231 can have a first input terminal, a second input terminal, and an output terminal. In some embodiments, the logic gate 231 can be configured to receive a first clock signal CLKA and a second clock signal CLKB through the first and second input terminals. In some embodiments, the frequency of the first clock signal CLKA is different from the frequency of the second clock signal CLKB. The logic gate 231 can be configured to generate a third clock signal CLKC in response to the first clock signal CLKA and the second clock signal CLKB. In some embodiments, the logic gate 231 can output the third clock signal CLKC through the output terminal of the logic gate 231.

The logic gate 231 can be OR gates, AND gates, XOR gates, XNOR gates and so on. In another embodiment, the logic gates 231 and 232 can be other types of logic gates (not shown).

In some embodiments, comparing to the first clock signal CLKA and the second clock signal CLKB, the third clock signal CLKC can be unpredictable since it is obtained based on a predetermined calculation in response to the first clock signal CLKA and the second clock signal CLKB. Taking the logic gate 231 being XOR gate for example, in principle, the output of a two input XOR is true only when the two input values are different, and false if they are equal, regardless of the value. Based on such calculation of XOR gate, the third clock signal CLKC can have an ununiformed frequency.

In some embodiments, the logic gate 232 can have a first input terminal electrically connected to the logic gate 231, a second input terminal, and an output terminal. The second input terminal and the output terminal of the logic gate 232 can be both electrically connected to the shift register 233. The logic gate 232 can be configured to receive the third clock signal CLKC through the first input terminal of the logic gate 232. In some embodiments, the second input terminal of the logic gate 232 can be configured to receive a bit value associated with the first number 23A outputted from the shift register 233. The logic gate 232 can be configured to generate a fourth clock signal CLKD in response to the third clock signal CLKC and the bit value associated with the first number 23A. In some embodiments, the logic gate 232 can output the fourth clock signal CLKD through the output terminal of the logic gate 232.

The logic gate 232 can be OR gates, AND gates, XOR gates, XNOR gates and so on. In some embodiments, the logic gates 231 and 232 can be the same or different logic gate. For example, the logic gates 231 and 232 can be both exclusive OR (XOR) gates. In another embodiment, the logic gates 231 and 232 can be other types of logic gates (not shown).

In some embodiments, having the bit value associated with the first number 23A feed backed to the logic gate 232, the fourth clock signal CLKD can be more unpredictable than the third clock signal CLKC.

The shift register 233 can includes a first input terminal electrically connected to the output terminal of the logic gate 232, a second input terminal configured to receive a fifth clock signal CLKE, and an output terminal connected to the counter 24. In some embodiments, the shift register 233 is an 8-bit shift register. Therefore, the output terminal of the shift register 233 can have 8-bits (as shown in FIG. 2). In other embodiments, the shifter register 233 can be more or less than 8-bits.

In some embodiments, the first input terminal of the shift register 233 can be configured to receive the fourth clock signal CLKD. In some embodiments, the first input terminal of the shift register 233 can be the data terminal. In some embodiments, the second input terminal of the shift register 233 can be the clock terminal.

The shift register 233 can be configured to generate the first number 23A in response to the fourth clock signal CLKD and the fifth clock signal CLKE. In some embodiments, the output terminal of the shift register 233 can be configured to output the first number 23A in response to the fourth clock signal CLKD.

The output terminal of the shift register 233 can be connected to the second input terminal of the logic gate 232, such that a bit value associated with the first number 23A is feed backed to the logic gate 232. For example, the 3-bit of the output terminal of the shift register 233 can be connected to the second input terminal of the logic gate 232. In some embodiments, the logic gate 232 can be configured to generate the fourth clock signal CLKD in response to the third clock signal CLKC and the bit value (for example, the bit value outputted at the 3-bit). The fourth clock signal CLKD can be associated with the present number outputted from the shift register 233.

The shift register 233 can be configured to generate a random number (i.e., the first number 23A) in response to the fourth clock signal CLKD as the data input and the fifth clock signal CLKE as the clock input. With the bit value associated with the first number 23A feed backed to the logic gate 232, the random number generator 23 can be non-pseudo. Therefore, the first number 23A can be harder to predict. Accordingly, the security of the memory device 2 can be improved.

The number trimmer 26 can be connected to the random number generator 23 and configured to receive the first number 23A. The number trimmer 26 can be a circuit for decreasing the first number 23A to be less than a threshold. In some embodiments, the number trimmer 26 can be configured to generate a modified first number 23B (or a second number 23B) according to the first number 23A. In some embodiments, the first number 23A can be modified by the number trimmer 26 to be the modified first number 23B when the first number 23A is greater than a first predetermined number. In some embodiments, the first predetermined number is the maximum accessing number between refresh cycles (detailed description thereof can be found in FIG. 3). After modification, the modified first number 23B is less than the first predetermined number. The modified first number 23B can be less than the first number 23A.

The modified first number 23B can be represented in a form identical to that of the first number 23A. In some embodiments, the first number and the modified number can both be in binary. For example, if the first number 23A is represented by a binary sequence having 8 bits, the modified first number 23B is also represented by a binary sequence having 8 bits. In some embodiments, the first number 23A can be represented in a binary sequence having Bit7, Bit6, Bit5, Bit4, Bit3, Bit2, Bit1, and Bit0. The modified first number 23B can be represented in a binary sequence having Bit7', Bit6', Bit5', Bit4', Bit3', Bit2', Bit1', and Bit0'.

The difference between the first number 23A and the modified first number 23B can be one bit of the binary sequence. For example, a most significant bit (msb) of the first number 23A can be different from that of the modified first number 23B. That is, Bit7' of the modified first number 23B is different from Bit7 of the first number 23A. In some embodiments, Bit6'~Bit0' of the modified first number 23B can be identical to Bit6~Bit0 of the first number 23A. In another embodiment, the modified first number 23B can be reset to zero by the number trimmer 26. Accordingly, Bit7'~Bit0' of the modified first number 23B are logic "0".

On the contrary, when the first number 23A is less than the first predetermined number, the number trimmer 26 will take no action on the first number 23A. In such a case, the modified first number 23B would be identical to the original first number 23A.

The counter 24 can be electrically coupled to the random number generator 23 and the number trimmer 26. In some embodiments, the counter 24 can be electrically coupled to the random number generator 23 through the number trimmer 26. The counter 24 can be configured to receive the modified first number 23B as an initial value of the counter 24. In one embodiment, when the first number 23A is less than the first predetermined number, the modified first number 23B is identical to the first number 23A, and the counter 24 decrements from the modified first number 23B (i.e., the first number 23A). In another embodiment, when the first number 23A is greater than the first predetermined number, the first number 23A is modified to the modified first number 23B, which is less than the first predetermined number, and the counter 24 decrements from the modified first number 23B, which is different from the first number 23A.

In some embodiments, the counter 24 is configured to be turned on in response to the refresh signal RS received from the controller 22. In other words, the counter 24 can be configured to start counting down in response to the refresh signal RS. The counter 24 can be configured to decrement (count down) from the initial value, i.e., the modified first number 23B.

In some embodiments, the counter 24 can be configured to decrement in response to an accessing signal, indicative of an access to one of the word lines.

The address register 25 can be electrically coupled to the counter 24. The address register 25 can be configured to obtain an address of a first word line 211 (or the possible target word line 211) that is active when the counter 24 decrements to zero, and store the address.

The controller 22 can be configured to access the address register 25 to obtain the address of the first word line and protect a second word line 212/213 (i.e., the adjacent word line 212 or 213) during a second refresh cycle. To protect the second word line 212/213, the controller can be configured to refresh the second word line 212/213 during the second refresh cycle in response to the refresh signal. In some embodiments, the second refresh cycle follows the first refresh cycle. For example, the second refresh cycle is the next refresh cycle of the first refresh cycle. In some embodiments, the address of the second word line 212/213 is adjacent to the address of the first word line 211.

The controller 22 can be configured to refresh one or more word line during one refresh cycle. In some embodiments, the controller 22 can be configured to refresh one, two, three, four, or more word lines at the same time. The controller 22 can be configured to refresh both adjacent word lines 212 and 213 during the same refresh cycle. In some embodiments, in addition to the second word line 212/213, the controller 22 can be configured to refresh a third word line 214 during the second refresh cycle in response to the refresh signal RS, where the address of the third word line 214 is apart from the address of the first word line 211.

In some embodiments, the controller 22 can be configured to refresh one word line adjacent to the possible target word line 211 and another word line apart from the possible target word line 211. For example, the word line 212 and the word line 214 can be refreshed during the second refresh cycle. In some embodiments, in one refresh cycle, the controller 22 can be configured to refresh two normal word lines (such as the word line 214) and two high risk word lines (such as the word lines 212 and 213), which are determined by the random number generator 23 and the counter 24.

In the present disclosure, the address of the first word line 211 (or the possible target word line 211) that is active can be obtained when the counter 24 decrements to zero. In such case, the address of the word line to be protected can be randomly selected from those word lines being active during two refresh cycles. In addition, the number trimmer 26 is provided to modify the first number 23A to be in a range from zero to the first predetermined number, so as to avoid the first number 23A greater than the maximum number of activations between two refresh cycles.

Figure 3:
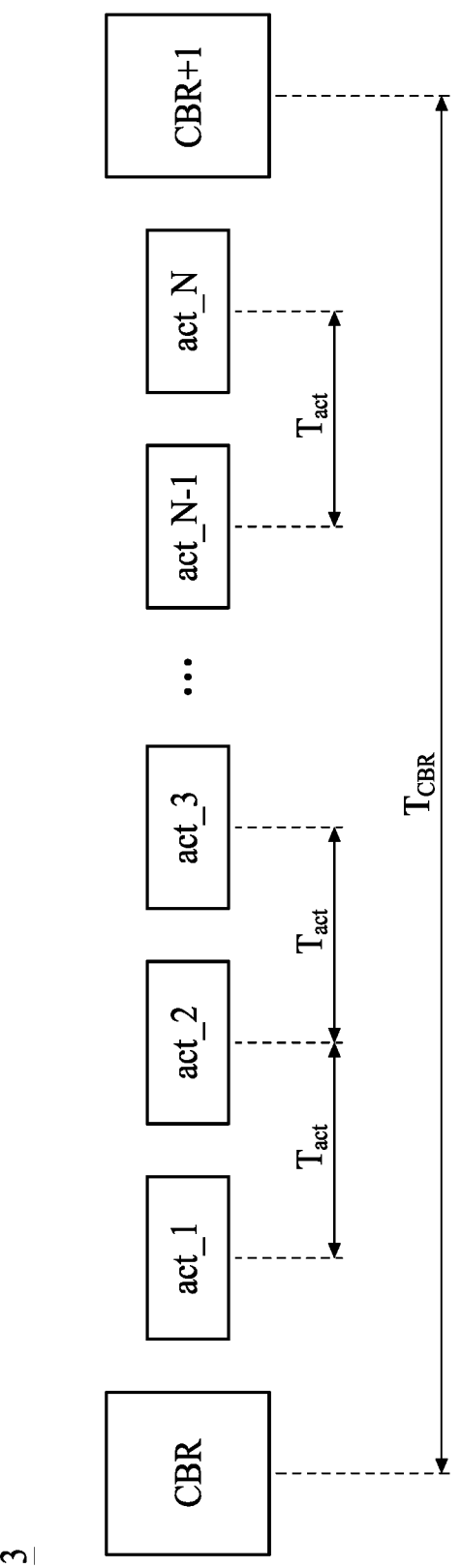
FIG. 3 is a schematic diagram illustrating activations to word lines between refresh cycles along a time line, in accordance with some embodiments of the present disclosure.

FIG. 3 is a schematic diagram 3 illustrating activations to word lines between refresh cycles along a time line, in accordance with some embodiments of the present disclosure.

Referring to FIG. 3, along the time line (i.e., the x-axis), a time period $T_{CBR}$ is between a first refresh cycle CBR and a second refresh cycle CBR+1. In some embodiments, the second refresh cycle CBR+1 is next to the first refresh cycle CBR. In some embodiments, a number N of activations (act_1, act_2, act_3, . . . , act_N−1, act_N) occurs between the first refresh cycle CBR and the second refresh cycle CBR+1. Each activation act_1, act_2, act_3, act_N−1, and act_N represent an access to a word line. The time period Tact is between two activations. For example, the time period Tact can be between the activations act_1 and act_2.

In some embodiments, the time period Tact can be the minimum essential time for accessing a word line (such as the first activation act_1).

To clearly elaborate the present disclosure, a memory array having 8 k of word lines is taken for example. The memory array can include 8192 word lines. In some embodiments, the time for refreshing all word lines (i.e., 8192 word lines) can be 64 ms. In such a case, the time period $T_{CBR}$, which is the needed time for refresh each word line, can be calculated as 64 ms/8192, and thus the time period $T_{CBR}$ would be 7.8125 μs. In other words, the time period $T_{CBR}$ shares between two refresh cycles can be 7.8125 us for a total 8 k word lines. Assuming the time period $T_{act}$ of 45.75 ns, the maximum accessing number $N_{max}$ between two refresh cycles can be calculated according to the equation $$N_{max} = \frac{T_{CBR}}{T_{act}}.$$

Therefore, the maximum accessing number $N_{max}$ can be 7.8125 μs/45.75 ns=170.765≈170, which means the number N in FIG. 3 being 170. There can be 170 word lines being accessed between two refresh cycles in this embodiment. Accordingly, the first number 23A received by the counter 24 can be modulated to be under a predetermined number (for example, 170 in this embodiment).

In some embodiments, the first number 23A can be less than a predetermined number, which is associated with the time period $T_{act}$ for accessing a word line and the time period $T_{CBR}$ between the first refresh cycle CBR and the second refresh cycle CBR+1. In some embodiments, the counter 24 can be configured to reset the initial value when the first number 23A is greater than the predetermined number. For example, the initial value of the counter 24 can be reset by resetting to zero or minus a constant to be less than the predetermined number. Accordingly, the counter 24 can start counting down from the initial value that is in a range of 0 to the predetermined number (i.e., the maximum accessing number between two refresh cycles), and when decrements to zero a word line can be selected to be protected during the next refresh cycle.

Figure 3A:
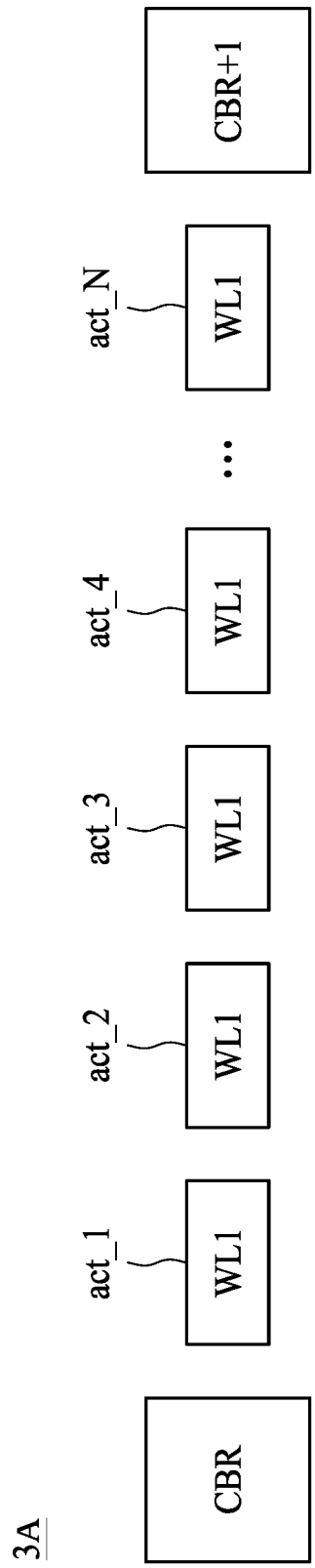
FIG. 3A is a schematic diagram illustrating accessed word line address at each activation between refresh cycles along a time line, in accordance with some embodiments of the present disclosure.

FIG. 3A is a schematic diagram 3A illustrating accessed word line address at each activation between refresh cycles CBR and CBR+1 along a time line, in accordance with some embodiments of the present disclosure.

Referring to FIG. 3A, the word line address WL1 is accessed at every activations act_1, act_2, act_3, act_4, . . . , and act_N. In such a case, no matter which initial value of the counter 24 is, the address register 25 would store the word line address WL1, which is accessed the most. In other words, the word line address WL1 can be the most possible target of the attacker. Therefore, selecting the word lines adjacent to the word line address WL1 to be protected can well prevent the row hammer effect occurs.

Figure 3B:
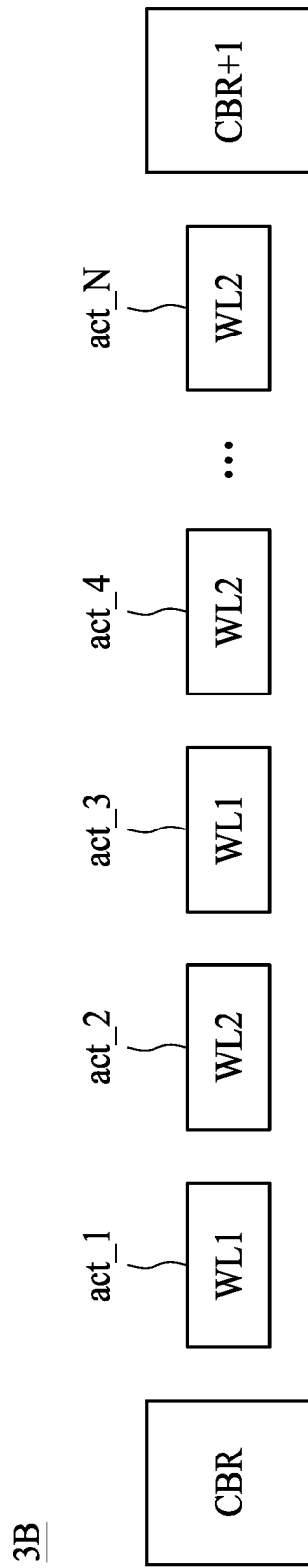
FIG. 3B is a schematic diagram illustrating accessed word line address at each activation between refresh cycles along a time line, in accordance with some embodiments of the present disclosure.

FIG. 3B is a schematic diagram 3B illustrating accessed word line address at each activation between refresh cycles CBR and CBR+1 along a time line, in accordance with some embodiments of the present disclosure.

Referring to FIG. 3B, the word line address WL1 is accessed at the activation act_1. The word line address WL2 is accessed at the activation act_2. The word line address WL1 is accessed at the activation act_3. The word line address WL2 is accessed at the activation act_4. The word line address WL2 is accessed at the activation act_N. That is, only word line addresses WL1 and WL2 are accessed. In such a case, no matter which initial value of the counter 24 is, the address register 25 would store either the word line address WL1 or WL2, which are accessed the most. In some embodiments, the attacked possibility of the word line addresses WL1 and WL2 are both 50%. In other words, the word line addresses WL1 and WL2 can be the most possible target of the attacker. Therefore, selecting the word lines adjacent to the word line address WL1 or WL2 to be protected can well prevent the row hammer effect occurs.

Figure 3C:
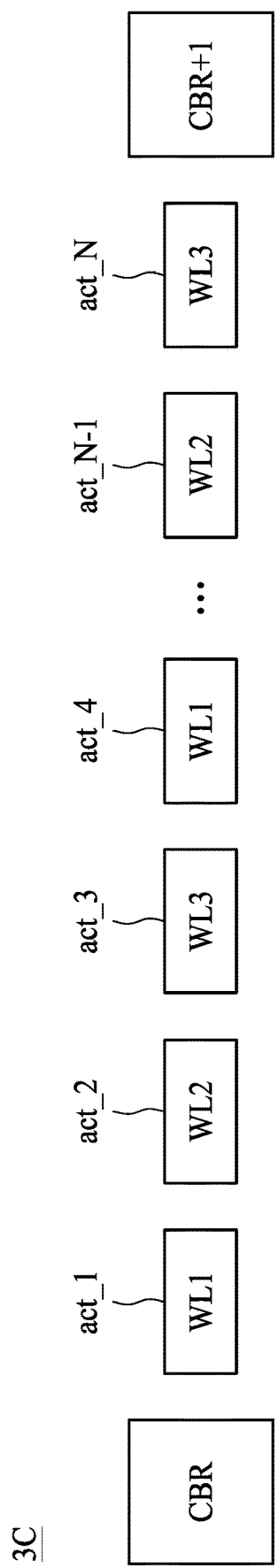
FIG. 3C is a schematic diagram illustrating accessed word line address at each activation between refresh cycles along a time line, in accordance with some embodiments of the present disclosure.

FIG. 3C is a schematic diagram 3C illustrating accessed word line address at each activation between refresh cycles CBR and CBR+1 along a time line, in accordance with some embodiments of the present disclosure.

Referring to FIG. 3C, the word line address WL1 is accessed at the activation act_1. The word line address WL2 is accessed at the activation act_2. The word line address WL3 is accessed at the activation act_3. The word line address WL1 is accessed at the activation act_4. The word line address WL2 is accessed at the activation act_N−1. The word line address WL3 is accessed at the activation act_N. In some embodiments, the word line addresses WL1, WL2, and WL3 are accessed in sequence repeatedly. That is, only word line addresses WL1, WL2, and WL3 are accessed between two refresh cycles. In such a case, the address register 25 would store one of the word line addresses WL1, WL2, and WL3. In some embodiments, the attacked possibility of the word line addresses WL1, WL2, and WL3 may be about 33.33%. In other words, the word line addresses WL1, WL2, and WL3 can be the most possible target of the attacker. Therefore, selecting the word lines adjacent to the word line address WL1, WL2, or WL3 to be protected can well prevent the row hammer effect occurs.

Figure 4:
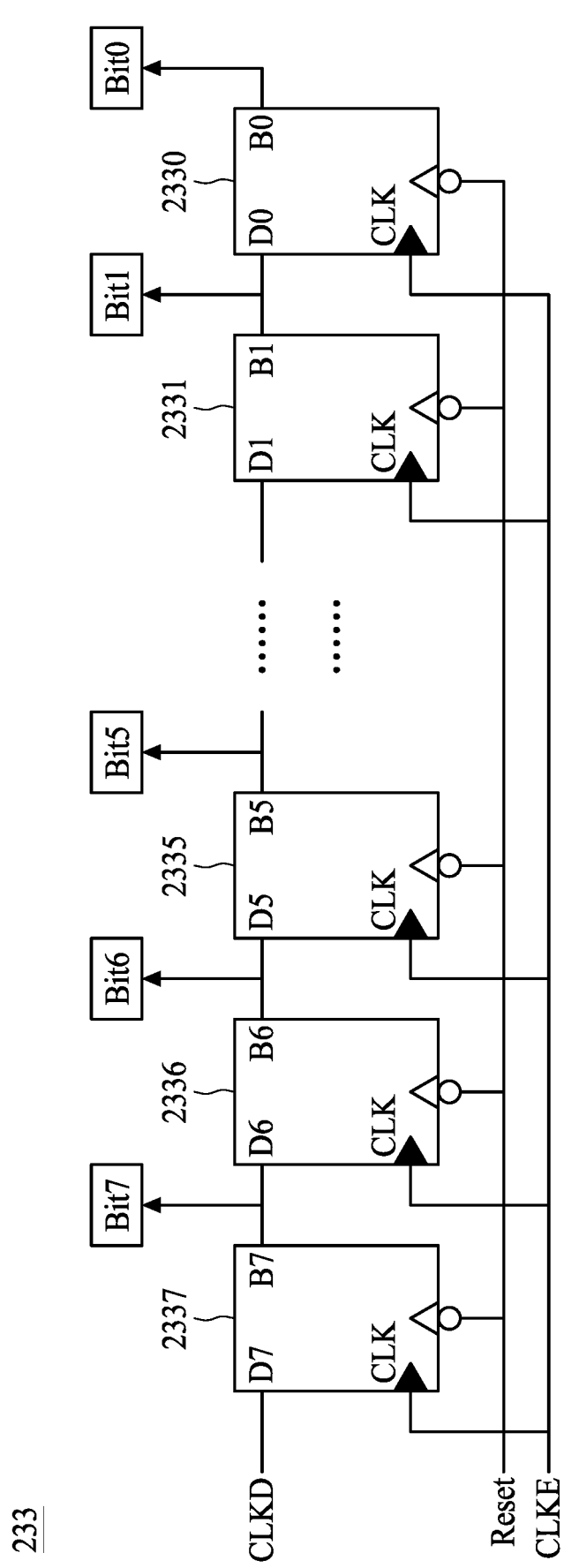
FIG. 4 is a schematic diagram of a shift register included in a memory device, in accordance with some embodiments of the present disclosure.

FIG. 4 is a schematic diagram of a shift register 233 included in a memory device, in accordance with some embodiments of the present disclosure.

Referring to FIG. 4, the shifter register 233 can include one or more flip-flops 2330, 2331, . . . , 2335, 2336, and 2337. In some embodiments, the flip-flops 2330, 2331, . . . , 2335, 2336, and 2337 can be any types of flip-flops, for example, D flip-flops. In some embodiments, the 8-bit shifter register 233 can include eight flip-flops 2330, 2331, . . . , 2335, 2336, and 2337. In some embodiments, the shift register 233 can be serial-in parallel-out configuration.

Each of the flip-flops 2330, 2331, . . . , 2335, 2336, and 2337 can have a data terminal, a clock terminal, a reset terminal and an output terminal. In some embodiments, the clock terminals of the flip-flops 2330, 2331, . . . , 2335, 2336, and 2337 are connected and configured to receive the clock signal CLKE (shown in FIG. 2). That is, the flip-flops 2330, 2331, . . . , 2335, 2336, and 2337 can operate at the given clock frequency of the clock signal CLKE. The reset terminals of the flip-flops 2330, 2331, . . . , 2335, 2336, and 2337 are connected and configured to receive a reset signal. In some embodiments, the flip-flops 2330, 2331, . . . , 2335, 2336, and 2337 can be reset in response to the reset signal. In some embodiments, each of the flip-flops 2330, 2331, . . . , 2335, 2336, and 2337 can have a set terminal (not shown).

In some embodiments, the data terminal D7 of the flip-flop 2337 can be configured to receive the clock signal CLKD (shown in FIG. 2). In response to the clock signals CLKD and CLKE, the output terminal B7 of the flip-flop 2337 can be configured to output a bit value Bit7 to be transmitted to the counter 24 and the data terminal D6 of the flip-flop 2336. In response to the bit value Bit7 and the clock signal CLKE, the output terminal B6 of the flip-flop 2336 can be configured to output a bit value Bit6 to be transmitted to the counter 24 and the data terminal D5 of the flip-flop 2335. In response to the bit value Bit6 and the clock signal CLKE, the output terminal B5 of the flip-flop 2335 can be configured to output a bit value Bit5 to be transmitted to the counter 24 and the data terminal D4 of the flip-flop 2334 (not shown). In some embodiments, the omitted flip-flops 2334, 2333, and 2332 can be arranged between the flip-flops 2335 and 2331 in a manner similar to the flip-flops 2336 and 2335. In response to the bit value Bit2 received at the data terminal D1 of the flip-flop 2331 and the clock signal CLKE, the output terminal B1 of the flip-flop 2331 can be configured to output a bit value Bit1 to be transmitted to the counter 24 and the data terminal D0 of the flip-flop 2330. In response to the bit value Bit1 and the clock signal CLKE, the output terminal B0 of the flip-flop 2330 can be configured to output a bit value Bit0 to be transmitted to the counter 24.

Data input of the shift register 233 is serial. Once the data has been clocked in, it may be either read off at each output terminal simultaneously, or it can be shifted out. Each input bit makes its way down to the Nth output after N clock cycles, leading to parallel output. The bit values Bit7, Bit6, Bit5, . . . , Bit1, and Bit0 can form the first number 23A in an 8-bit form. Referring back to FIG. 2, the output terminal of the shift register 233 can be connected to the second input terminal of the logic gate 232, such that a bit value associated with the first number 23A is feed backed to the logic gate 232. In some embodiments, the feed backed bit value can be one of the bit values Bit7, Bit6, Bit5, . . . , Bit1, and Bit0 shown in FIG. 4.

The shift register 233 can be configured to generate a random number (such as the first number 23A) in response to the data signal (i.e., the clock signal CLKD) and the clock signal CLKE. The unpredictable clock signal CLKC is generated based on asynchronous clock signals CLKA and CLKB through the logic gate 231. Furthermore, the clock signal CLKD may be more unpredictable since it is generated based on the unpredictable clock signal CLKC and a feed backed bit value associated with the first number 23A. In such a case, the clock signal CLKD can be more unpredictable. Without any pseudo algorithm, the random number generator 23 can be configured to generate a more unpredictable number. Accordingly, the row hammer attacker cannot predict or know the word line address that the memory device will protect.

Figure 5:
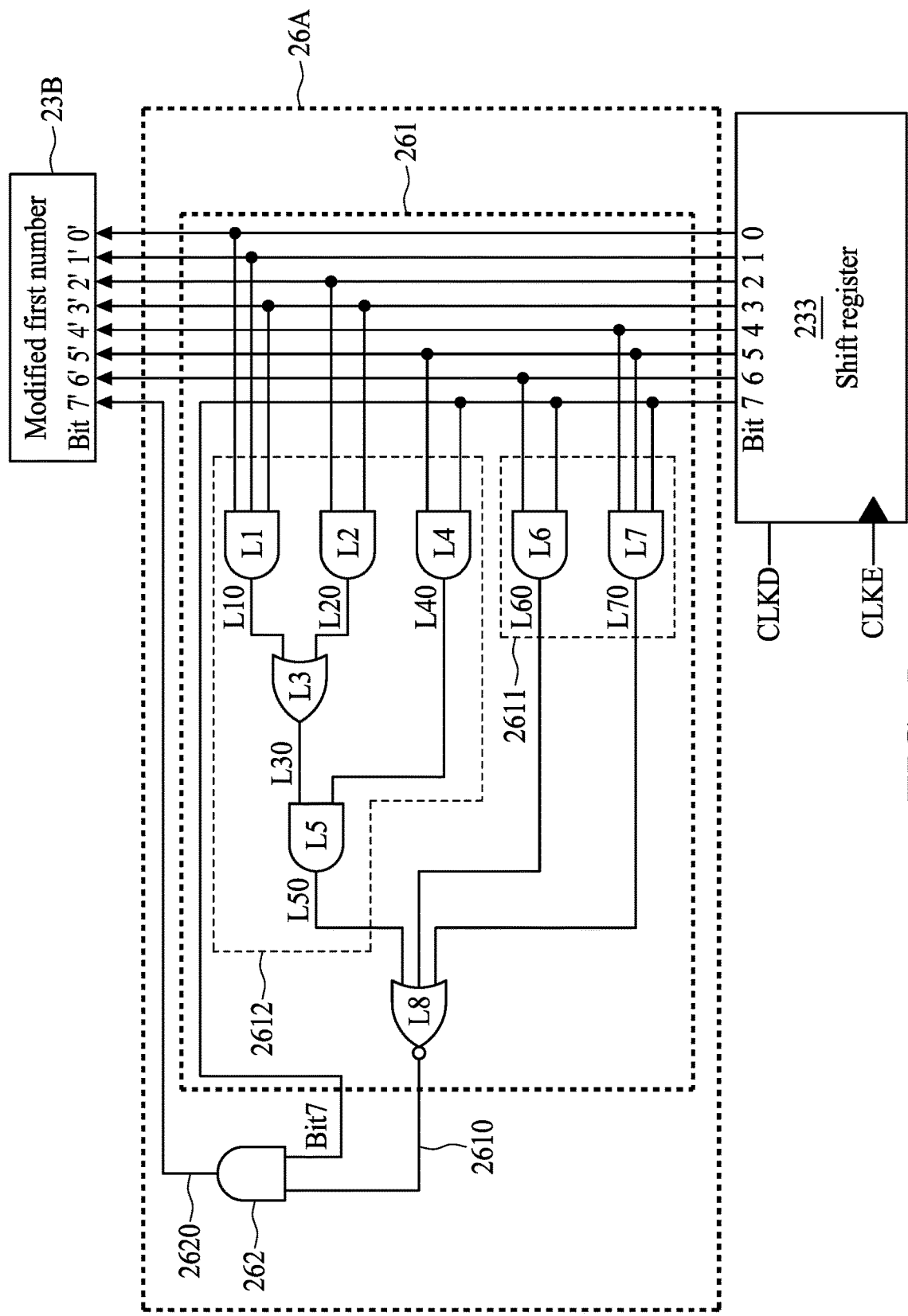
FIG. 5 is a schematic diagram of a number trimmer included in a memory device, in accordance with some embodiments of the present disclosure.

FIG. 5 is a schematic diagram of a number trimmer 26A included in a memory device, in accordance with some embodiments of the present disclosure. The number trimmer 26A is an embodiment of the number trimmer 26 shown in FIG. 2. The number trimmer 26A is configured to reset a most significant bit (msb) of the first number 23A when it is greater than the first predetermined number.

Referring to FIG. 5, the number trimmer 26A can include a determination unit 261 and an AND gate 262. The determination unit 261 can be configured to receive the first number 23A from the random number generator 23. In some embodiments, the determination unit 261 can be configured to determine whether the first number 23A is greater than the first predetermined number, and output a determination result 2610.

The AND gate 262 can have one input terminal connected to the random number generator 23, another input terminal connected to the determination unit 261, and an output terminal connected to the counter 24. In some embodiments, the AND gate 262 can be configured to receive the most significant bit Bit7 of the first number 23A and the determination result 2610, and generate an AND output 2620 in response to the most significant bit Bit7 of the first number 23A and the determination result 2610. In some embodiments, the AND gate 262 can be configured to transmit the AND output 2620 to the counter 24 as the most significant bit Bit7' of the modified first number 23B.

In principle, the output of a two input AND gate is true only when all input values are logic "1", and false if not all inputs to the AND gate are logic "1". Based on such calculation of AND gate 262, the AND output 2620 can be expressed as Truth Table 1.

TRUTH TABLE 1

| Bit7 | 2610 | 2620/Bit7' |
|------|------|------------|
| 0 | 0 | 0 |
| 0 | 1 | 0 |
| 1 | 0 | 0 |
| 1 | 1 | 1 |

In some embodiments, the determination result 2610 being logic high indicates that the first number 23A is less than the predetermined number. On the contrary, the determination result 2610 being logic low indicates that the first number 23A is greater than the predetermined number. Accordingly, when the determination result 2610 is logic low (logic "0") and Bit7 of the first number 23A is logic high (logic "1"), the AND output 2620 will be logic low to decrease the first number 23A to be the modified first number 23B. That is, the most significant bit (msb) of the first number 23A can be reset to logic "0". In some embodiments, when the first number 23A is greater than the first predetermined number, the number trimmer 26A can be configured to minus the first number 234 by 128 (i.e., 27) to be the modified first number 23B. For example, when the first number 23A is of 171, which is greater than the first predetermined number of 170, the number trimmer 26A can minus the first number 23A by 128 to generate the modified first number 23B of 42.

The determination unit 261 can be a circuit including one or more logic gates. In some embodiments, the determination unit 261 can include a first portion 2611, a second portion 2612, and a logic gate L8.

In some embodiments, the first portion 2611 can includes two AND gates L6 and L7. The AND gate L6 can have two input terminals connected to the shift register 233 of the random number generator 23, and configured to receive Bit5 and Bit7 of the first number 23A, respectively. The AND gate L6 is configured to generate an output L60 at an output terminal in response to Bit5 and Bit7 of the first number 23A. The AND gate L7 can have three input terminals connected to the shift register 233 of the random number generator 23, and configured to receive Bit4, Bit5, and Bit7 of the first number 23A, respectively. The AND gate L7 is configured to generate an output L70 at an output terminal in response to Bit4, Bit5, and Bit7 of the first number 23A.

The first portion 2611 can be configured to determine whether a first part of the binary sequence of the first number 23A is greater than a first threshold. In some embodiments, when the first number 23A is represented by a binary sequence having 8 bits, the first part of the binary sequence of the first number 23A can be 4 bits (for example, the first four digits). In some embodiments, the first threshold can be represented by a binary sequence having 4 bits (for example, the first four digits of the first predetermined number). For example, if the first predetermined number is 170, which can be represented as 10101010 in binary, the first threshold can be represented as 1010 in binary.

In some embodiments, the second portion 2612 includes AND gates L1, L2, L4, and L5, and an OR gate L3. The AND gate L1 can have three input terminals connected to the shift register 233 of the random number generator 23, and configured to receive Bit0, Bit1, and Bit3 of the first number 23A, respectively. The AND gate L1 is configured to generate an output L10 at an output terminal in response to Bit0, Bit1, and Bit3 of the first number 23A. The AND gate L2 can have two input terminals connected to the shift register 233 of the random number generator 23, and configured to receive Bit2 and Bit3 of the first number 23A, respectively. The AND gate L2 is configured to generate an output L20 at an output terminal in response to Bit2 and Bit3 of the first number 23A. The output terminals of the AND gates L1 and L2 are connected to the OR gate L3 as inputs. The OR gate L3 is configured to generate an output L30 at an output terminal in response to the outputs L10 and L20.

The AND gate LA can have two input terminals connected to the shift register 233 of the random number generator 23, and configured to receive Bit5 and Bit7 of the first number 23A, respectively. The AND gate L4 is configured to generate an output L40 at an output terminal in response to Bit5 and Bit7 of the first number 23A. The AND gate L5 can have two input terminals connected to the OR gate L3 and the AND gate L4, respectively, and configured to receive the outputs L30 and L40, respectively. The AND gate L5 is configured to generate an output L50 at an output terminal in response to the outputs L30 and L40.

The second portion 2612 can be configured to determine whether a second part of the binary sequence of the first number 23A is greater than a second threshold in a condition of the first part of the binary sequence of the first number 23A greater than and equal to the first threshold. In some embodiments, when the binary sequence of the first number 23A has 8 bits, the second part of the binary sequence of the first number 23A can be 4 bits (for example, the last four digits). In some embodiments, the second threshold can be represented by a binary sequence having 4 bits (for example, the last four digits of the first predetermined number). For example, if the first predetermined number is 170, which can be represented as 10101010 in binary, the second threshold can be represented as 1010 in binary. In some embodiments, the AND gate L4 is configured to determine whether the first part of the binary sequence of the first number 23A is greater than and equal to the first threshold.

In some embodiments, each of the first portion 2611 and the second portion 2612 can compare a part of the first number 23A with a corresponding part of the first predetermined number. Then, the result of the first portion 2611 and the second portion 2612 can be combined and output a final determination result (i.e., the determination result 2610) by the logic gate L8.

In some embodiments, the logic gate L8 can be a NOR gate. The NOR gate L8 can be connected to the first portion 2611 and the second portion 2612. In some embodiments, the NOR gate L8 can have three input terminals connected to the AND gates L5, L6, and L7, respectively, and configured to receive the outputs L50, L60, and L70, respectively. In some embodiments, the NOR gate L8 is configured to generate the determination result 2610 at an output terminal in response to the outputs L50, L60, and L70. Based on such calculation of NOR gate L8, the determination result 2610 can be expressed as Truth Table 2.

TRUTH TABLE 2

| L50 | L60 | L70 | 2610 |
|---|---|---|---|
| 0 | 0 | 0 | 1 |
| 0 | 0 | 1 | 0 |
| 0 | 1 | 0 | 0 |
| 1 | 0 | 0 | 0 |
| 0 | 1 | 1 | 0 |
| 1 | 0 | 1 | 0 |
| 1 | 1 | 0 | 0 |
| 1 | 1 | 1 | 0 |

The NOR gate L8 outputs logic "1" only when the outputs L50, L60, and L70 are all logic "0". In some embodiments, the determination result 2610 being logic high indicates that the first number 23A is less than the predetermined number. On the contrary, the determination result 2610 being logic low indicates that the first number 23A is greater than the predetermined number. In such a case, the most significant bit (msb) of the first number 23A can be reset to logic "0" when the determination result 2610 is logic low and Bit7 of the first number 23A is logic high.

Taking the first predetermined number being 170 for example, the outputs of the logic gates of the number trimmer 26A can be expressed as Tables 1 to 5 when the first number 23A is 127, 128, 170, 171, and 187, respectively.

TABLE 1

| 23A | Bit 7 | Bit 6 | Bit 5 | Bit 4 | Bit 3 | Bit 2 | Bit 1 | Bit 0 |
|---|---|---|---|---|---|---|---|---|
| 127 | 0 | 1 | 1 | 1 | 1 | 1 | 1 | 1 |
| L10 | L20 | L30 | L40 | L50 | L60 | L70 | 2610 | 2620 |
| 1 | 1 | 1 | 0 | 0 | 0 | 0 | 1 | 0 |

TABLE 2

| 23A | Bit 7 | Bit 6 | Bit 5 | Bit 4 | Bit 3 | Bit 2 | Bit 1 | Bit 0 |
|---|---|---|---|---|---|---|---|---|
| 128 | 1 | 0 | 0 | 0 | 0 | 0 | 0 | 0 |
| L10 | L20 | L30 | L40 | L50 | L60 | L70 | 2610 | 2620 |
| 0 | 0 | 0 | 0 | 0 | 0 | 0 | 1 | 1 |

TABLE 3

| 23A | Bit 7 | Bit 6 | Bit 5 | Bit 4 | Bit 3 | Bit 2 | Bit 1 | Bit 0 |
|---|---|---|---|---|---|---|---|---|
| 170 | 1 | 0 | 1 | 0 | 1 | 0 | 1 | 0 |
| L10 | L20 | L30 | L40 | L50 | L60 | L70 | 2610 | 2620 |
| 0 | 0 | 0 | 1 | 0 | 0 | 0 | 1 | 1 |

TABLE 4

| 23A | Bit 7 | Bit 6 | Bit 5 | Bit 4 | Bit 3 | Bit 2 | Bit 1 | Bit 0 |
|---|---|---|---|---|---|---|---|---|
| 171 | 1 | 0 | 1 | 0 | 1 | 0 | 1 | 1 |
| L10 | L20 | L30 | L40 | L50 | L60 | L70 | 2610 | 2620 |
| 1 | 0 | 1 | 1 | 1 | 0 | 0 | 0 | 0 |

TABLE 5

| 23A | Bit 7 | Bit 6 | Bit 5 | Bit 4 | Bit 3 | Bit 2 | Bit 1 | Bit 0 |
|---|---|---|---|---|---|---|---|---|
| 187 | 1 | 0 | 1 | 1 | 1 | 0 | 1 | 1 |
| L10 | L20 | L30 | L40 | L50 | L60 | L70 | 2610 | 2620 |
| 1 | 0 | 1 | 1 | 1 | 0 | 1 | 0 | 0 |

The determination unit 261 shown in FIG. 5 is one exemplary circuit for determining whether the first number 23A is greater than the first predetermined number. In some embodiments, the determination unit 261 can be achieved by other configurations for determining whether the first number 23A is greater than the same first predetermined number. In another embodiments, to comparing the first number with different first predetermined number, the determination unit 261 can be achieved by different configurations according to needs.

The number trimmer 26A is provided to determine whether the random number (i.e., the first number 23A) exceeds the first predetermined number (i.e., the maximum number of activations between two refresh cycles), and then modify the random number to be in a range of 0 to the first determined number. The number trimmer 26A modifies the most significant bit of the first number 23A, such that the first number 23A can be modified slightly to maintain the randomness. The operations of number trimmer 26A do not relate to the process of the random number generator 23, and thus the randomness of the first number 23A would not be impacted.

Figure 6:
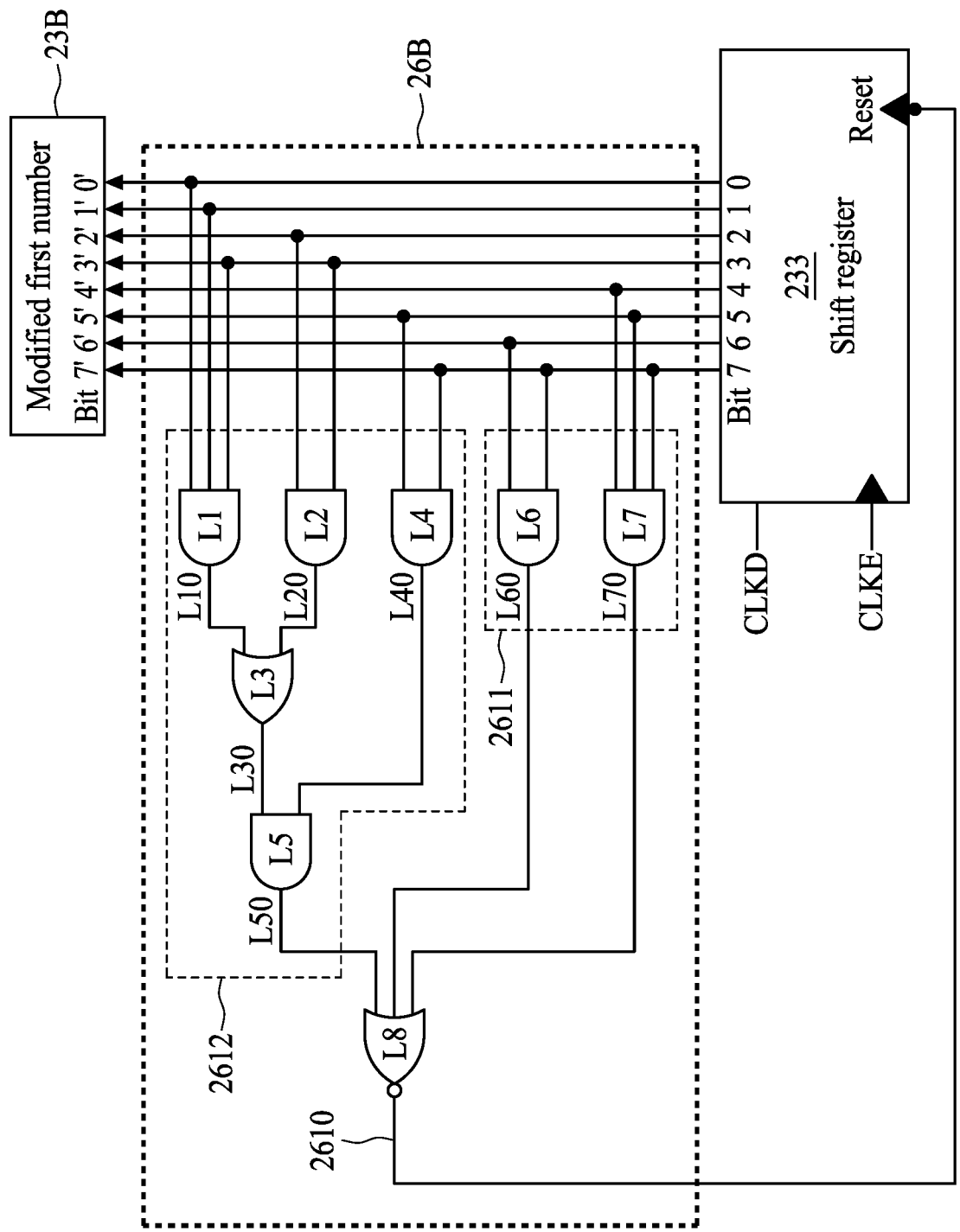
FIG. 6 is a schematic diagram of a number trimmer included in a memory device, in accordance with some embodiments of the present disclosure.

FIG. 6 is a schematic diagram of a number trimmer 26B included in a memory device, in accordance with some embodiments of the present disclosure. The number trimmer 26B is an embodiment of the number trimmer 26 shown in FIG. 2. The number trimmer 26B is configured to reset the shift register 233 (i.e., the random number generator 23) when the first number 23A is greater than the first predetermined number, such that the modified first number 23B can be reset to zero.

The number trimmer 26B is similar to the number trimmer 26A, differing therefrom in that, in FIG. 6, the output terminal of the logic gate L8 is directly connected to the reset terminal of the shift register 233 to reset the shift register 233. In some embodiments, the difference between the number trimmer 26A and the number trimmer 26B is that the number trimmer 26A includes the AND gate 262.

As described above, the configuration of the number trimmer 26B can be used to determine whether the first number 23A is greater than the first predetermined number. When the first number 23A is determined greater than the first predetermined number (for example, 170), the output of the NOR gate L8 (i.e., the determination result 2610) can be transmitted to the shift register 233 to reset the shift register 233. Therefore, the modified first number 23B can be reset to zero.

The number trimmer 26B is provided to determine whether the random number (i.e., the first number 23A) exceeds the first predetermined number (i.e., the maximum number of activations between two refresh cycles), and then reset the random number generator 23 so that the random number would be zero, which is less than the first determined number. Therefore, using the number trimmer 26B can have a higher possibility to obtain the first accessed word line following the previous refresh cycle.

Figure 7:
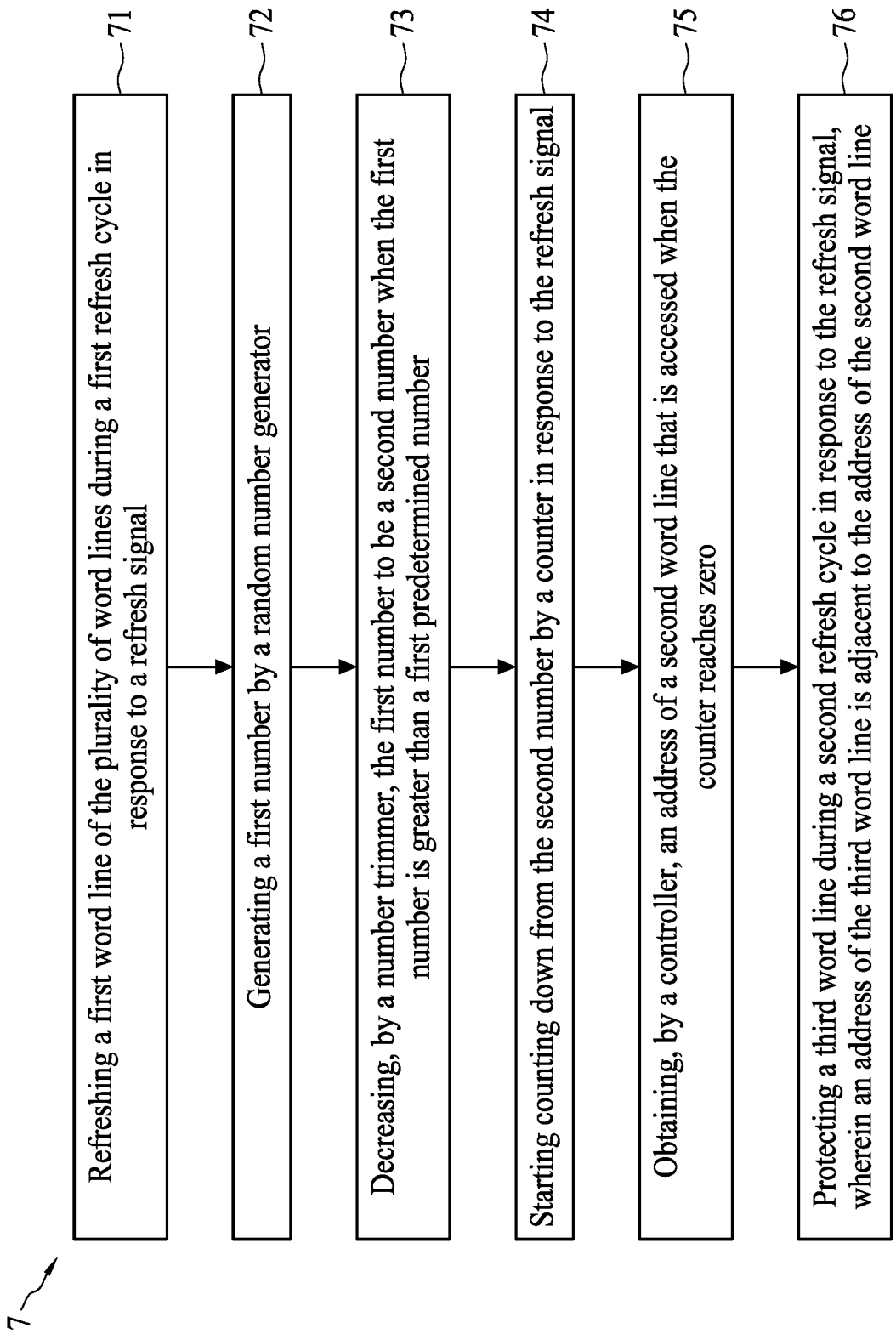
FIG. 7 is a flowchart of a method for protecting a memory device, in accordance with some embodiments of the present disclosure.

FIG. 7 is a flowchart of a method 7 for protecting a memory device, in accordance with some embodiments of the present disclosure. In some embodiments, the method 7 is for protecting a word line included in the memory device. In some embodiments, the memory device can include a plurality of word lines.

In operation 71, a first word line of the plurality of word lines can be refreshed during a first refresh cycle in response to a refresh signal. In some embodiments, the controller (for example, the controller 22 shown in FIG. 2) of the memory device can refresh one or more word lines in each refresh cycle in response to the refresh signal. In some embodiments, the operation 71 can be performed by the controller 22 shown in FIG. 2.

In operation 72, a first number can be generated by a random number generator. In some embodiments, the random number generator (for example, the random number generator 23 shown in FIG. 2) can be configured to generate a random number based on different signals. In some embodiments, the operation 72 can be performed by the random number generator 23 shown in FIG. 2.

In operation 73, the first number can be decreased to be a second number by a number trimmer, when the first number is greater than a first predetermined number. In some embodiments, the second number can be a modified first number. In some embodiments, the first number and the second number can be in binary. The difference between the first number and the second number can be one bit of the binary sequence. For example, a most significant bit (msb) of the first number can be different from that of the second number. In another embodiment, the second number can be zero. In some embodiments, the operation 73 can be performed by the number trimmer 26 shown in FIG. 2.

In operation 74, a counter can start counting down from the second number in response to the refresh signal. In some embodiments, in response to the refresh signal, the counter can be configured to be turned on to start counting. The counter can count down from the second number. In some embodiments, each counting down is triggered by an accessing signal indicative of an access to one word line. In some embodiments, the operation 74 can be performed by the counter 24 shown in FIG. 2.

In operation 75, an address of a second word line being accessed can be obtained by a controller when the counter reaches zero. In some embodiments, the address of the second word line can be obtained and stored in an address register (for example, the address register 25 shown in FIG. 2) when the counter counting down to zero. The controller (for example, the controller 22 shown in FIG. 2) can be configured to access the address register and obtain the address of the second word line. In some embodiments, the operation 75 can be performed by the controller 22 with/without the address register 25 shown in FIG. 2.

In operation 76, a third word line can be protected during a second refresh cycle by refreshing the third word line in response to the refresh signal, wherein an address of the third word line is adjacent to the address of the second word line. In some embodiments, the operation 76 can be performed by the controller 22 shown in FIG. 2.

To implement the row hammer, the memory attacker tends to access one or more target word lines in a highly frequency. The great amount of accesses to the target word line can lead to row hammer effect occurring on the word lines adjacent to the target word lines. That is, under the row hammer effect, the content of the nearby word lines may change by leaking their charges, even though those nearby word lines are not accessed.

The present disclosure provides a memory device that can determine a possible target word line to be attacked and then protect the word lines adjacent to the possible target word line. The random number generator can generate a random number to be an initial value of the counter, and then the target word line address being accessed can be obtained when the counter reaches zero. In addition, to avoid the random number generated by the random number generator greater than the maximum number of activations between two refresh cycles, the number trimmer is provided to modify the random number to be in a range from zero to a predetermined number (i.e., the maximum number of activations between two refresh cycles). Accordingly, the word lines adjacent to the target word line, which is accessed frequently, can be refreshed to maintain the same content.

One aspect of the present disclosure provides a memory device. The memory device includes a plurality of word lines, a controller configured to refresh at least one of the plurality of word lines during a first refresh cycle in response to a refresh signal, a random number generator configured to generate a first number, and a number trimmer connected to the random number generator. The number trimmer is configured to generate a modified first number according to the first number, wherein the modified first number is less than a first predetermined number. The memory device further includes a counter electrically coupled to the random number generator and the number trimmer, wherein the counter is configured to receive the modified first number as an initial value of the counter, and configured to be turned on in response to the refresh signal. The controller is further configured to obtain an address of a first word line being accessed when the counter counts to zero, and refresh a second word line during a second refresh cycle, wherein an address of the second word line is adjacent to the address of the first word line.

Another aspect of the present disclosure provides a memory device. The memory device includes a controller configured to refresh at least one of a plurality of word lines during a first refresh cycle in response to a refresh signal, a random number generator configured to generate a first number, a number trimmer connected to the random number generator. The number trimmer is configured to modify the first number to be a modified first number, and the modified first number is less than a first predetermined number. The memory device further includes a counter electrically coupled to the random number generator and configured to receive the modified first number as an initial value of the counter and start counting from the initial value in response to the refresh signal, and an address register electrically coupled to the counter and configured to store an address of a first word line being active when the counter decrements to zero. The controller is configured to access the address register to obtain the address of the first word line and protect a second word line during a second refresh cycle, wherein an address of the second word line is adjacent to the address of the first word line.

Another aspect of the present disclosure provides a method for protecting a memory device, wherein the memory device includes a plurality of word lines. The method includes refreshing a first word line of the plurality of word lines during a first refresh cycle in response to a refresh signal; generating a first number by a random number generator; decreasing, by a number trimmer, the first number to be a second number when the first number is greater than a first predetermined number; starting counting down from the second number by a counter in response to the refresh signal; obtaining, by a controller, an address of a second word line being accessed when the counter reaches zero; protecting a third word line during a second refresh cycle in response to the refresh signal, wherein an address of the third word line is adjacent to the address of the second word line.

The embodiments of the present disclosure provide a memory device having a protect circuit for selecting and protecting a possible attacked word line. In particular, the protect circuit of the memory device can protect the word lines (memory cells) from row hammer. To trigger the row hammer, the attacker rapidly activates the same memory rows, such that the adjacent memory rows that are not activated may leak their charges. The present protect circuit provides a random number generator and a counter, so as to randomly select and protect a possible memory row. The counter can be configured to count down from a random number generated by the random number generator. When the counter counts to zero, an address of the memory row that is activated can be obtained. In other words, the memory row is selected within those having activated between refresh cycles. In such a case, the selecting pool includes the memory rows having activated between refresh cycles. In addition, to avoid the random number generated by the random number generator exceeds the maximum number of activations between two refresh cycles, the number trimmer is provided to modify the random number to be in a range from zero to a predetermined number (i.e., the maximum number of activations between refresh cycles). Because the nearby memory rows adjacent to those activated memory rows have a higher possibility of occurring row hammer effect, they will be the protected target in the following refresh cycle.

Generally, the activation amount to trigger the row hammer cannot be accomplished within two refresh cycles. For example, a memory device with 8192 rows can have about 170 activations between two refresh cycles, and the activation amount for triggering the row hammer may be 10000 or more to the same row. Therefore, protecting additional memory row that possibly occurs row hammer in every refresh cycle can eliminate the row hammer issue. Furthermore, the memory device can include a number trimmer to determine whether the random number, for choosing a particular one from memory rows, exceeds the maximum number of activations between two refresh cycles (i.e., 170 in this case), and then decrease the random number to be in a range of 0 to 170. Accordingly, security and performance of the memory device can be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A memory device, comprising:
    a plurality of word lines;
    a controller configured to refresh at least one of the plurality of word lines during a first refresh cycle in response to a refresh signal;
    a random number generator configured to generate a first number;
    a number trimmer connected to the random number generator, wherein the number trimmer is configured to generate a modified first number according to the first number, wherein the modified first number is less than a first predetermined number; and
    a counter electrically coupled to the random number generator and the number trimmer, wherein the counter is configured to receive the modified first number as an initial value of the counter, and configured to be turned on in response to the refresh signal,
    wherein the controller is further configured to obtain an address of a first word line being accessed when the counter counts to zero, and refresh a second word line during a second refresh cycle, wherein an address of the second word line is adjacent to the address of the first word line.

2. The memory device of claim 1, wherein the number trimmer is configured to reset the random number generator, such that the modified first number is reset to zero.

3. The memory device of claim 1, wherein the first number is a positive integer.

4. The memory device of claim 1, wherein the first number is represented by a binary sequence having more than 2 bits.

5. The memory device of claim 4, wherein the first number is represented by a binary sequence having 8 bits.

6. The memory device of claim 4, wherein the number trimmer is configured to reset a most significant bit (msb) of the first number when the first number is greater than the first predetermined number.

7. The memory device of claim 6, wherein the number trimmer comprises:
    a determination unit configured to receive the first number and determine whether the first number is greater than the first predetermined number, and output a determination result; and
    an AND gate configured to receive the most significant bit of the first number and the determination result, and generate an AND output in response to the most significant bit of the first number and the determination result,
    wherein the AND gate is configured to transmit the AND output to the counter as the most significant bit of the modified first number.

8. The memory device of claim 7, wherein the determination unit comprises:
    a first portion configured to determine whether a first part of the binary sequence of the first number is greater than a first threshold;
    a second portion configured to determine whether a second part of the binary sequence of the first number is greater than a second threshold in a condition of the first part of the binary sequence of the first number greater than and equal to the first threshold; and
    a first logic gate connected to the first portion and the second portion, wherein the first logic gate is configured to generate the determination result.

9. The memory device of claim 1, wherein the number trimmer comprises one or more logic gates.

10. The memory device of claim 1, wherein the first predetermined number is associated with a first time period for accessing a word line and a second time period between the first refresh cycle and the second refresh cycle.

11. A memory device, comprising:
- a controller configured to refresh at least one of a plurality of word lines during a first refresh cycle in response to a refresh signal;
- a random number generator configured to generate a first number;
- a number trimmer connected to the random number generator, wherein the number trimmer is configured to modify the first number to be a modified first number, wherein the modified first number is less than a first predetermined number;
- a counter electrically coupled to the random number generator and configured to receive the modified first number as an initial value of the counter and start counting in response to the refresh signal; and
- an address register electrically coupled to the counter and configured to store an address of a first word line being active when the counter decrements to zero,
- wherein the controller is configured to access the address register to obtain the address of the first word line and protect a second word line during a second refresh cycle, wherein an address of the second word line is adjacent to the address of the first word line.

12. The memory device of claim 11, wherein the number trimmer is configured to reset the random number generator, such that the modified first number is reset to zero.

13. The memory device of claim 11, wherein the first number is a positive integer.

14. The memory device of claim 11, wherein the first number is in binary and greater than 2-bit.

15. The memory device of claim 14, wherein the first number is 8-bit.

16. The memory device of claim 14, wherein the number trimmer is configured to reset a most significant bit (msb) of the first number when the first number is greater than the first predetermined number.

17. The memory device of claim 16, wherein the number trimmer comprises:
- a determination unit configured to receive the first number and determine whether the first number is greater than the first predetermined number, and output a determination result; and
- an AND gate configured to receive the most significant bit of the first number and the determination result, and generate an AND output in response to the most significant bit of the first number and the determination result,
- wherein the AND gate is configured to transmit the AND output to the counter as the most significant bit of the modified first number.

18. The memory device of claim 17, wherein the determination unit comprises:
- a first portion configured to determine whether a first part of the binary sequence of the first number is greater than a first threshold;
- a second portion configured to determine whether a second part of the binary sequence of the first number of the first number is greater than a second threshold in a condition of the first part of the binary sequence of the first number greater than and equal to the first threshold; and
- a first logic gate connected to the first portion and the second portion, wherein the first logic gate is configured to generate the determination result.

19. The memory device of claim 11, wherein the number trimmer comprises one or more logic gates.

20. The memory device of claim 11, wherein the first predetermined number is associated with a first time period for accessing a word line and a second time period between the first refresh cycle and the second refresh cycle.

* * * * *